(12) United States Patent
Hata et al.

(10) Patent No.: US 6,842,359 B2
(45) Date of Patent: Jan. 11, 2005

(54) CONTENT ADDRESSABLE MEMORY DEVICE HAVING AN OPERATION MODE SETTING MEANS

(75) Inventors: Ryuichi Hata, Mihama-ku (JP); Masahiro Konishi, Mihama-ku (JP); Naoki Kanazawa, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/360,924

(22) Filed: Feb. 10, 2003

(65) Prior Publication Data

US 2003/0156440 A1 Aug. 21, 2003

(30) Foreign Application Priority Data

Feb. 15, 2002 (JP) ........................................ 2002-038312

(51) Int. Cl.[7] ............................................. G11C 15/00
(52) U.S. Cl. .................................. 365/49; 365/189.07
(58) Field of Search .............................. 365/49, 189.07

(56) References Cited

U.S. PATENT DOCUMENTS

| | | | |
|---|---|---|---|
| 5,371,697 A | * | 12/1994 | Yamada ........................ 365/49 |
| 5,621,677 A | | 4/1997 | Jones |
| 6,252,788 B1 | * | 6/2001 | Maesako et al. ............... 365/49 |
| 6,349,049 B1 | * | 2/2002 | Schoy ........................... 365/49 |
| 6,400,594 B2 | | 6/2002 | Hata et al. |

* cited by examiner

Primary Examiner—Huan Hoang
(74) Attorney, Agent, or Firm—Oliff & Berridge, PLC

(57) ABSTRACT

A CAM (content addressable memory) device capable of flexibly coping with a wide range of user requirements with respect to operation speed and/or power consumption has operation mode setting means, generates a higher or lower internal voltage than an external power-supply voltage depending on the setting, and at least part of the internal circuit is operated by the internal voltage. In particular, the high level of the search-bit line and/or the high level of the match line are preferably set to the internal voltage. Also, the CAM device has bit line amplitude adjusting means for adjusting the amplitude of the bit line depending on the setting of the operation mode setting means and/or match line amplitude adjusting means for adjusting the amplitude of match line on which a search result is output, and thus is capable of appropriately changing the operation speed and power consumption depending on the setting.

17 Claims, 7 Drawing Sheets

CONTENT ADDRESSABLE MEMORY DEVICE HAVING AN OPERATION MODE SETTING MEANS

BACKGROUND OF THE INVENTION

1. Field of the Invention

The present invention relates to a content addressable memory device (hereinafter, referred to as a CAM device) whose operation speed and power consumption can be suitably changed as necessary.

2. Description of the Related Art

FIG. 9 is a schematic diagram of an example of a conventional CAM device. A CAM device 128 shown in FIG. 9 has a CAM cell array 130 holding n-bit wide×m words, a decoder 132, a bit line control circuit 134, a match detector 136, a flag generator 138, and a priority encoder 140. In this regard, although not shown in the figure, the bit line control circuit 134 includes a bit line pre-charge circuit, a bit line driver, a sense amplifier, a search data register, a mask register, and the like.

In the CAM device 128, writing/reading of storage data is carried out in the same manner as a usual RAM. Specifically, when writing, the decoder 132 selects the word line WL corresponding to an address ADR. The bit line driver drives data DATA and the inverted data thereof /DATA on each bit line BIT and bit-bar line /BIT, respectively, as storage data in order to write the data into the word of the memory address selected by the address ADR.

Also, when reading, the decoder 132 selects the word line WL corresponding to the address ADR in the same manner, and the storage data DATA and the inverted data thereof /DATA stored in the selected word are read out on each corresponding bit line BIT and bit-bar line /BIT, respectively. Then the sense amplifier detects this, and the storage data stored in the word is read out as the data DATA.

As described above, after storage data is written in each word of the CAM cell array 130, a search is performed by entering search data as the data DATA and instructing the start of the search. The search data is held in the search data register, the search data and the inverted data thereof are driven on each bit line BIT and bit-bar line /BIT, respectively, and a comparison is made as to whether or not the search data and the storage data are matched for all words simultaneously.

The search result is detected for each word by the match detector 136 through the match line ML, and is entered into the flag generator 138 and the priority encoder 140. The flag generator 138 detects a "no match" state, a "single match" state, or a "plurality of matches" state, and outputs it as a flag. When there are matches, the priority encoder 140 outputs the memory address of the matched word having the highest priority, which is set in advance, as the highest-priority hit address (HHA).

In the following, a detailed description will be further given of the search operation in the CAM device 128, by referring to a specific example of a CAM cell 142 shown in FIG. 10. The CAM cell 142 is composed of static RAM (SRAM).

In the CAM cell 142, a search is performed by setting the bit line BIT and the bit-bar line /BIT to a low level, turning off two N-type MOS transistors (hereinafter, referred to as NMOSs) 148 and 150, whose sources are connected to ground, pre-charging the match line ML to the power-supply voltage, and then driving the search data and the inverted data of thereof on the bit line BIT and the bit-bar line /BIT, respectively.

At this time, if the storage data and the search data match, one of two NMOSs 144 and 148, and one of NMOSs 146 and 150, which are connected in series between the match line ML and ground, are in an off state, and thus the match line ML remains in the pre-charged state. On the other hand, if they do not match, both of the NMOSs 144 and 148 or both of the NMOSs 146 and 150 are in an on state, and thus the match line ML is discharged through the two NMOSs connected in series to ground.

In the case of the CAM device 128 shown in FIG. 9, one word is composed of n CAM cells 142, and the match lines ML of the CAM cells constituting the same word are connected together. Thus only when match is detected for all the CAM cells 142 in one word, the match line ML holds the pre-charged voltage. On the other hand, when even a CAM cell 142 in one word is detected to be unmatched, the match line ML is charged or discharged, and becomes the voltage level having a logic level opposite to that of the pre-charged voltage.

The CAM cell 142 shown in FIG. 10 is an unmatched detection type, and when unmatched, the match line ML is discharged. However, in a search operation, the majority of words usually become unmatched, and thus, in the case of the CAM cell 142, the majority of the match lines ML are discharged from the pre-charged voltage to the ground voltage, and are fully swung between the power-supply voltage and the ground voltage for each search cycle.

Also, the bit line pair BIT and /BIT are pre-charged to the power-supply voltage during standby after reading/writing the storage data. However, at search time, the bit line pair is discharged to the ground voltage temporarily and then the match line ML is pre-charged to the power-supply voltage. Thereafter, either the bit line BIT or bit-bar line /BIT needs to be driven again to the power-supply voltage depending on the search data.

This means that, in order to pre-charge the match line ML, the bit line pair BIT and /BIT must be set to the ground level, and an amount of current is consumed.

In this manner, during a search operation, the majority of match lines ML and bit line pairs BIT and /BIT are pre-charged and discharged at the same time, thus there has been a problem in that, as CAM devices become larger and faster, the power consumption thereof increases. However, in the CAM device, the search data and all words need to be searched at the same time, in principle. Therefore, unlike the case of a conventional RAM, means for reducing the power consumption by dividing the memory array into blocks or banks and operating only the selected block or bank cannot be adopted.

Also, CAM devices have come into widespread use for address filtering and packet classification, etc. in network relay equipment, for example, switching hubs, routers, and the likes, thanks to the evolution of the Internet. This equipment has a wide variety, ranging from low-end equipment used for small-scale LANs (Local Area Networks), to high-end equipment used by ISPs (Internet Service Providers). Thus the search operation speed and power consumption required for the CAM devices used in these pieces of equipment have become very broad ranging.

In general, that is to say, not limited only to the case of the CAM devices, improving the operation speed and reducing the power consumption are difficult to achieve simultaneously, and thus, in the conventional CAM devices, vendors cannot help but narrow down the customer target in order to optimize the operation speed and the power consumption. Accordingly, for each user, available CAM devices do not necessarily have specifications best suited for the user from the viewpoint of operation speed and power consumption. Thus a situation has arisen in which users cannot necessarily obtain satisfactory products.

In other words, in order to satisfy a wide range of users, the vendors need to develop a plurality of types of CAM devices corresponding to the equipment requirements specified by the users. However, with this method, there is a problem in that there is an enormous burden on the vendors. Also, for example, in order to reduce the power consumption of a CAM device, reducing the power-supply voltage supplied to the CAM device from the outside is effective; however, it is unrealistic, because this drastically reduces the operation speed.

SUMMARY OF THE INVENTION

Accordingly, it is an object of the present invention to solve the problems arising from the above-described conventional techniques and to provide a CAM device capable of flexibly coping with a wide range of user requirements in terms of the operation speed and the power consumption.

In order to achieve the above-described object, according to the present invention, there is provided a CAM device including: operation mode setting means; and an internal voltage generation circuit which generates a higher or lower voltage than a power-supply voltage, which is supplied from the outside, depending on a setting of the operation mode setting means, wherein at least part of an internal circuit of the CAM device is operated by the internal voltage generated by the internal voltage generation circuit.

Here, at least one of a high level voltage of search-bit lines and a high level voltage of match lines, on which a search result between storage data and search data is output, is preferably set to the internal voltage generated by the internal voltage generation circuit.

Also, the internal voltage generation circuit includes a P-type MOS transistor disposed between a power-supply voltage line and an internal voltage line, and an N-type MOS transistor disposed between the power-supply voltage line and the internal voltage line, and the internal voltage is preferably generated by turning on one of the P-type MOS transistor and the N-type MOS transistor depending on the setting of the operation-mode setting means.

Also, according to the present invention, there is provided a CAM device including: operation mode setting means, and depending on the setting of the operation mode setting means, at least one of the bit line amplitude adjusting means for adjusting the amplitude of the bit line and the match line amplitude adjusting means for adjusting an amplitude of match lines on which a search result is output.

Here, the bit line includes both the storage-data bit line and the search-data bit line. When these lines are wired independently, at least one of these may have the bit line amplitude adjusting means. Further the bit line may be a single line or a complementary pair line.

Furthermore, the search-bit line amplitude adjusting means may have a first pre-charging circuit of a first internal node, a first switch circuit including more than one switch which is controlled on/off depending on the setting of the operation mode setting means, and more than one first capacitor which is individually connected to the first internal node through corresponding first switches included in the first switch circuit, at standby time, the adjusting means electrically may separate the search-bit line pair from the first internal node, the first pre-charging circuit may pre-charge the first internal node to the pre-charge voltage having a logic level opposite to that of the search-bit line pair at standby time, and, at the same time, may pre-charge the first capacitor which is connected to the first internal node through the first switch to be turned on, depending on the setting of the operation-mode setting means, at search time, the search-bit line amplitude adjusting means may connect one of the search-bit line pair and the first internal node, and may generate an intermediate voltage which is determined depending on a capacitance pre-charged in the first capacitor connected to the first internal node.

Also, depending on the setting of the operation-mode setting means, the first pre-charging circuit preferably determines whether the first internal node is pre-charged only at standby time, or whether the first internal node is pre-charged during a time period from the time when one line of the search-bit line pair and the first internal node are electrically connected to the time when a search is started.

Also, the match line amplitude adjusting means has a second pre-charging circuit for a second internal node, a second switch circuit including a plurality of second switches which are controlled on/off depending on the setting of the operation mode setting means, and a plurality of second capacitors which are individually connected to the second internal node through corresponding second switches included in the second switch circuit, at standby time, the adjusting means electrically may separate the match line from the second internal node, the second pre-charging circuit pre-charges the second internal node to the pre-charge voltage having a logic level opposite to that of the match line, at the same time, may pre-charge the second capacitor which is connected to the second internal node through the second switch to be turned on, depending on the setting of the operation mode setting means, at search time, the adjusting means electrically may connect the match line and the second internal node, and may generate an intermediate voltage which is determined depending on the capacitance pre-charged in the second capacitor connected to the second internal node.

Also, the match line amplitude adjusting means may be connected between the match line and a sense node, and may include a first transistor which is controlled on/off by a clamp voltage, a second transistor which pre-charges the match line depending on the setting of the operation mode setting means, and at the same time, generates the clamp voltage to control the first transistor on/off, and a pre-charging means of the sense node, at standby time, may pre-charge the sense node, and at the same time, the second transistor may pre-charge the match line to an intermediate voltage lower or higher, by the threshold voltage of the second transistor, than a gate voltage of the second transistor, which is controlled depending on the setting of the operation mode setting means, and may set the clamp voltage to the same voltage as the pre-charge voltage of the match line.

Also, in any one of the CAM devices described above, the device further may include: a reference-voltage generation circuit which generates a reference voltage for detecting the voltage after match detection of the match line; and a match sense amplifier which detects the voltage after match detection of the match line based on the reference voltage, and amplifies and outputs the voltage as a match-sense output, wherein the reference-voltage generation circuit may have a third pre-charging circuit for a third internal node, a third switch circuit including a plurality of third switches which are controlled on/off depending on the setting of the operation mode setting means, and a plurality of third capacitors which are individually connected to the third internal node through corresponding third switches included in the third switch circuit, at standby time, the reference voltage line and the third internal node are electrically separated, the third pre-charging circuit pre-charges the third internal node to the pre-charge voltage having a logic level opposite to that of the reference-voltage line, at the same time, may pre-charge the third capacitor which is connected to the third internal node through the third switch to be turned on, depending on the setting of the operation mode setting means, at search time, the reference-voltage line and the internal node are electrically connected, and as the reference voltage, an intermediate voltage is generated, which is determined depending on the capacitance pre-charged in the third capacitor connected to the third internal node.

DESCRIPTION OF THE PREFERRED EMBODIMENTS

A detailed description will be given of the CAM device of the present invention based on the preferred embodiments shown in the accompanying drawings.

Figure 1:
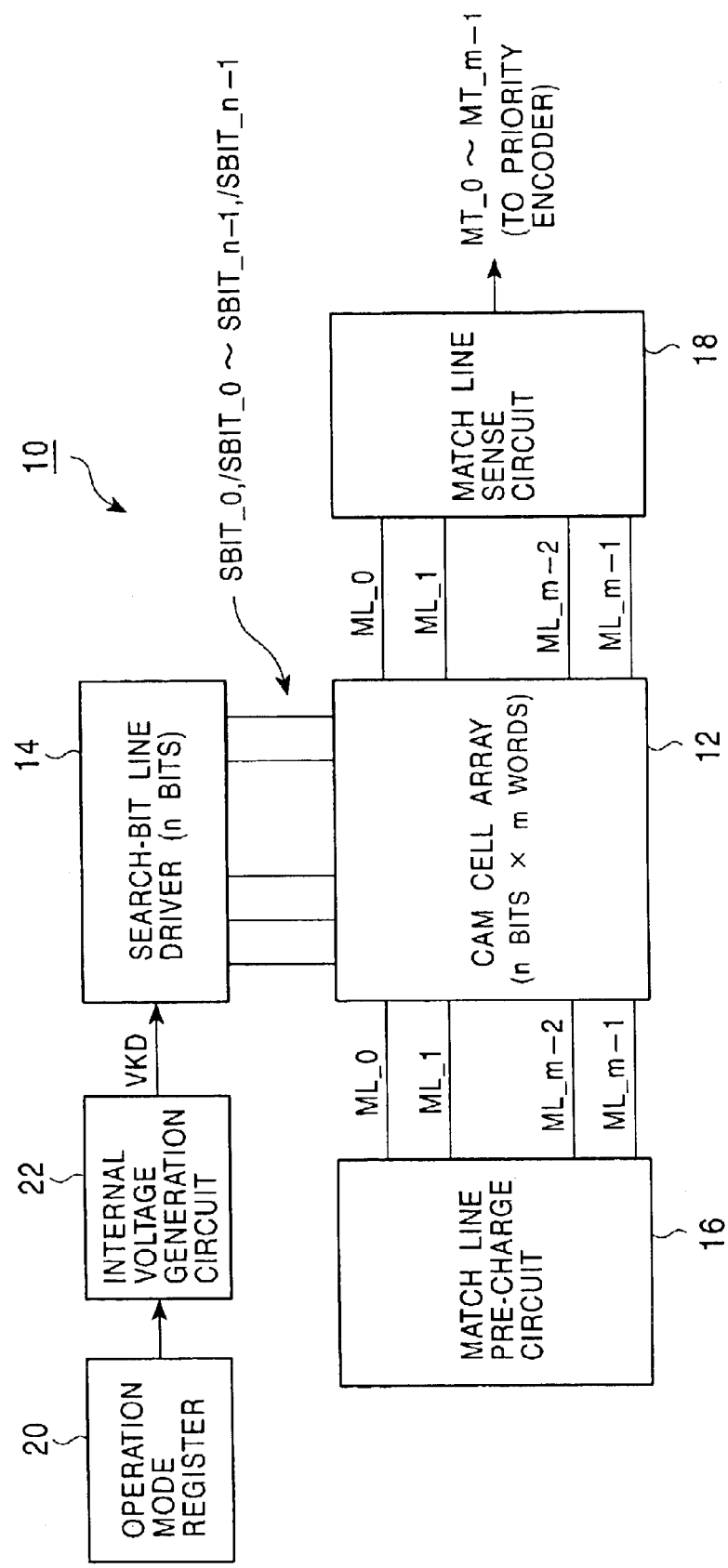
FIG. 1 is a schematic diagram of a CAM device according to a first embodiment of the present invention.

FIG. 1 is a schematic diagram of a CAM device according to a first embodiment of the present invention.

FIG. 1 illustrates only the characteristic part of a CAM device 10 according to the present invention. Basically, the CAM device 10 includes a CAM cell array 12, a search-bit line driver 14, a match detection circuit having a match line pre-charge circuit 16 and a match line sense circuit 18, an operation mode register 20, and an internal voltage generation circuit 22.

Although omitted in FIG. 1 in order to simplify the description, the CAM device 10 is provided with, for example, an address decoder, a bit line pair driver of the storage data for reading/writing the storage data from/into a CAM cell, a priority encoder for encoding the address of the CAM word at which a match is detected in accordance with priority, and the like. Also, for each component omitted from the figure, the conventional well-known means can be applied.

In the CAM device 10 shown in FIG. 1, the operation mode register 20 holds information for determining the operation mode of the CAM device 10. The operation mode includes at least two modes for changing the internal voltage generated by the internal voltage generation circuit 22 described below. This operation mode register 20 is, for example, set to an operation mode having a relatively high internal voltage when attaching importance to operation speed, whereas the register is set to an operation mode having a relatively low internal voltage when attaching importance to power consumption.

In this regard, the operation mode setting means of the present invention is not limited to a register, and any conventional well-known means having the same function can be used. The operation mode setting means may be, means capable of setting the operation mode variably, as necessary, like external pins, etc. in addition to the register of the present embodiment. Also, means for setting the operation mode fixedly (invariably) using, for example, a mask pattern for manufacturing LSIs, may be used, and all the conventional well-known means can also be used.

Next, in the CAM device 10, the internal voltage generation circuit 22 generates a predetermined internal voltage to be used in the CAM device 10 corresponding to the operation mode set in the operation mode register 20. This internal voltage generation circuit 22 may be a voltage decreasing circuit which generates a lower internal voltage than the power-supply voltage when a relatively high voltage of the power-supply voltage is supplied from the outside of the CAM device 10. On the other hand, a voltage increasing circuit which generates a higher internal voltage than the power-supply voltage when a relatively low voltage of the power-supply voltage is supplied may be used.

In the CAM device 10 shown in FIG. 1, the internal voltage generated by the circuit 22 is supplied only to the search-bit line driver 14 which is one of the parts having the largest power consumption. But, the present invention is not limited to this, and the internal voltage generated by the circuit 22 may be supplied to a part of the internal circuit, including the search-bit line pair SBIT and /SBIT, which have a particularly large power consumption, and the match line ML, or the internal voltage may be supplied to the entire internal circuit of the CAM device 10.

The specific circuit structure of the circuit 22 is not limited at all. For example, as a means for driving the search-bit line pair SBIT and /SBIT at a high level, a simple structure in which both PMOSs and NMOSs are provided between the power supply and the search-bit line pair individually, and either the PMOS or the NMOS is selectively turned on corresponding to the setting of the operation mode register 20 can be adopted. By this means, the high level of the search-bit line pair can be the power-supply voltage (when turning on the PMOS), or the power-supply voltage minus the threshold voltage Vth of NMOS (when turning on the NMOS).

Next, in the CAM device 10, the CAM cell array 12 has CAM cells disposed in an array of n bits wide×m words.

Figure 2:
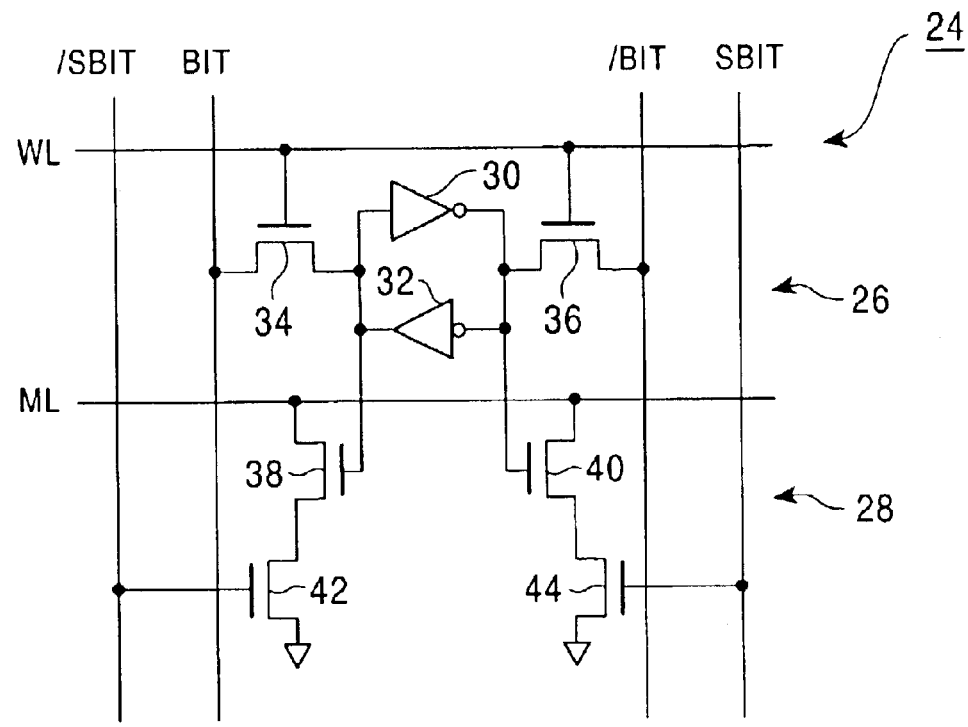
FIG. 2 is a circuit diagram of a CAM cell used in a CAM device according to an embodiment of the present invention.

FIG. 2 is a circuit diagram of a CAM cell according to an embodiment of the present invention.

The CAM cell 24 shown in FIG. 2 includes a memory cell 26 for storing one-bit data and a comparator 28 for comparing the one-bit data stored in the memory cell 26 and the search bit supplied from the outside. The CAM cell 24 is connected to the storage-data bit line (hereinafter, referred to as a data-bit line) pair BIT and /BIT, and the search-data bit line (hereinafter, referred to as a search-bit line) pair SBIT and /SBIT with independently wiring.

Here, the memory cell 26 is a conventional well-known SRAM cell, and includes two inverters 30 and 32, and two N-type MOS transistors (hereinafter, referred to as NMOSs) 34 and 36. The gates of the two NMOSs 34 and 36 are commonly connected to the word line WL.

The comparator 28 includes NMOSs 38, 40, 42, and 44. The NMOSs 38 and 42 are connected in series between the match line ML and ground, and their gates are connected to the output of the inverter 32 of the memory cell 26 and to the search-bit-bar line /SBIT, respectively. In the same manner, the NMOSs 40 and 44 are connected in series between the match line ML and ground, and their gates are connected to the output of the inverter 30 of the memory cell 26 and to the search-bit line SBIT, respectively.

Figure 10:
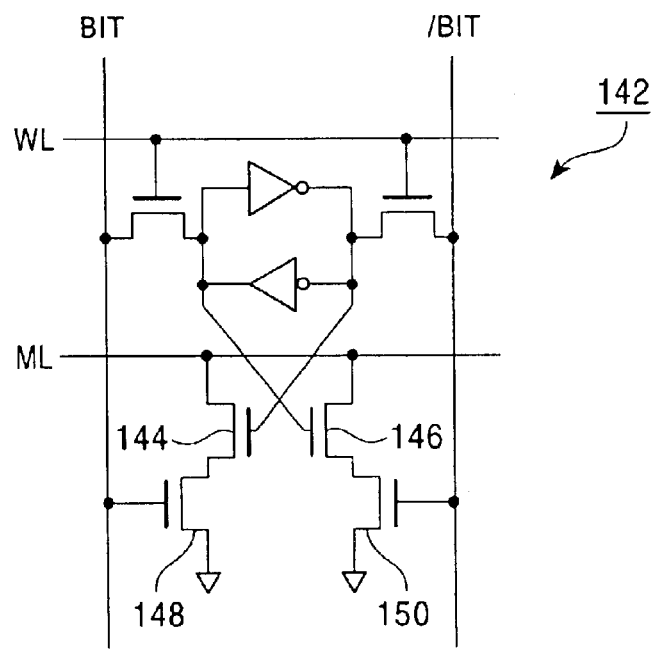
FIG. 10 is a circuit diagram of an example of the conventional CAM cell.

The operation of the CAM cell 24 shown in FIG. 2 is basically the same as that of the CAM cell 142 shown in FIG. 10. In the case of the CAM cell 24, the data-bit line pair and the search-bit line pair are independently wired. This is preferable, because the data-bit line pair can be set to the power-supply voltage and the search-bit line pair can be set to the ground level during standby.

Also, in the CAM cell 24, since the search-bit line pair and the data-bit line pair are wired independently, their load capacity is reduced by half. Thus even if the CAM device 10 has a large capacity, the power consumption at search time can be reduced by half, and the CAM device 10 can be operated at high speed. In this regard, the increase in the layout area is insignificant, because multilevel interconnections are currently used.

Also, the CAM cell is not limited to the example shown in FIG. 2, and all types of conventional well-known CAM cells can be applied. In the example shown in FIG. 2, the memory cell 26 is an SRAM, however, the memory cell is not limited to this, and may be a DRAM or various types of ROM. Also, the structure of the comparator 28 is not limited. It is also possible to use a CAM cell, as shown in FIG. 10.

Next, in the CAM device 10, the search-bit line driver 14 drives the individual search-bit line pair SBIT and /SBIT corresponding to n-bit CAM cells 24 included in one word in response to the search data supplied from the outside. In the present embodiment, the high level voltage when searching the search-bit line is driven to the internal voltage generated by the internal voltage generation circuit 22.

Figure 3:
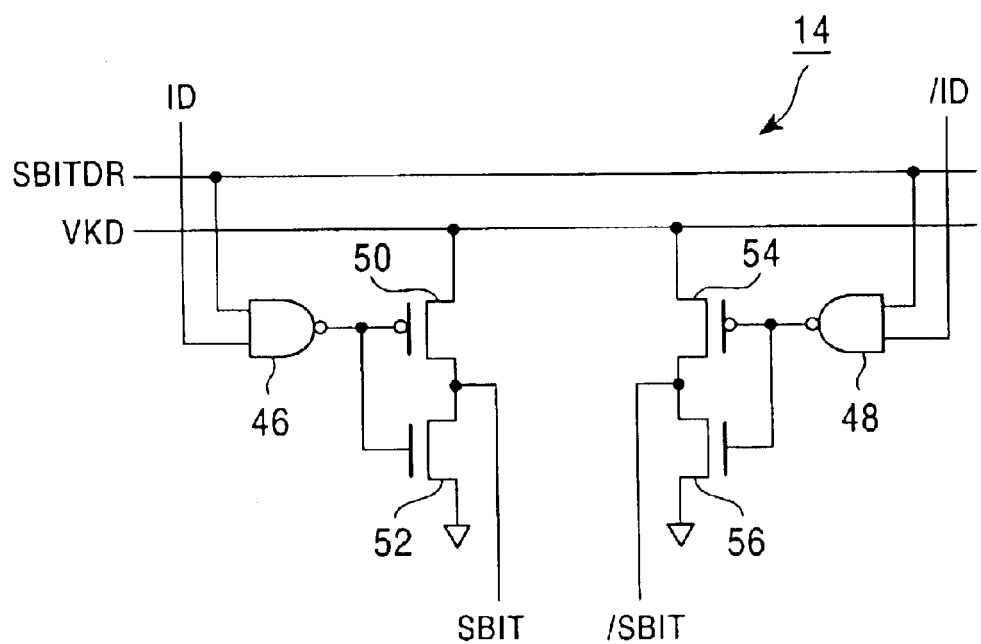
FIG. 3 is an example of a search-bit line driver used in a CAM device according to the first embodiment of the present invention.

FIG. 3 is a circuit diagram of a search-bit line driver according to an embodiment of the present invention.

Only one-bit portion of the search-bit line driver is illustrated. The driver includes a NAND gate 46 which works as a control circuit of the search-bit line SBIT, a PMOS 50 for charging, an NMOS 52 for discharging, a NAND gate 48 which works as a control circuit of the search-bit-bar line /SBIT, a PMOS 54 for charging, and an NMOS 56 for discharging.

Search-data ID and a signal SBITDR are entered to the two inputs of the NAND gate 46, and the output of the gate is commonly connected to the gates of the PMOS 50 and the NMOS 52. Also, the PMOS 50 is connected between the line VKD and the search-bit line SBIT, and the NMOS 52 is connected between the search-bit line SBIT and ground.

In the same manner, the inverted search-data /ID and the signal SBITDR are entered into the two inputs of the NAND gate 48, and the output of the gate is commonly connected to the gates of the PMOS 54 and the NMOS 56. Also, the PMOS 54 is connected between the line VKD and the search-bit-bar line /SBIT, and the NMOS 56 is connected between the search-bit-bar line /SBIT and ground.

Here, the signal SBIDR is a signal instructing the start of the search. In the case of FIG. 3, the signal is set to a low level (in the following, described as low) during standby, and is set to a high level (in the following, described as high) at search time. The line VKD is a supply line of the internal voltage supplied from the circuit 22. The high level of the search-bit line SBIT becomes the level of this internal voltage.

First, at standby time, the signal SBITDR is set to low as described above. As a result, both of the outputs of the NAND gates 46 and 48 become high, turning off the PMOSs 50 and 54 and turning on the NMOSs 52 and 56. Specifically, both lines of the search-bit line pair SBIT and /SBIT are discharged to the ground voltage through the NMOSs 52 and 56, respectively.

At search time, the search-data ID and its inverted data /ID are entered, and the signal SBITDR is set to high.

At this time, if the signal ID is high, that is, the signal /ID is low, the output of the NAND gate 46 becomes low, and thus the PMOS 50 is turned on and the NMOS 52 is turned off. Therefore, the search-bit line SBIT is charged up to the internal voltage supplied as the voltage VKD from the circuit 22 through the PMOS 50.

On the other side, the output of the NAND gate 48 remains in a high state. Accordingly, the search-bit-bar line /SBIT remains in a state discharged to the ground voltage through NMOS 56.

Here, the high level of the search-bit lines SBIT and /SBIT is enough to be a voltage (the threshold voltage Vth of the NMOSs 42 and 44 or more) capable of turning on the NMOSs 42 and 44 of the comparator 28 of the CAM cell 24 shown in FIG. 2. The lower the voltage, the lower the power consumption becomes, however, the speed of discharging the match line ML becomes low, and thus the search operation takes more time. To put it another way, by changing the internal voltage depending on the setting of the operation mode register 20, it is possible to appropriately adjust to the desired operation speed and power consumption.

Next, in the CAM device 10, for example, in the case of the CAM cell 24 shown in FIG. 2, the match line pre-charge circuit 16 pre-charges the match line ML to the high level at standby time. As a result of the search, if the n-bit data for one word completely matches the n-bit search-data individually, the match line ML remains at the high level, whereas if even one of the bits does not match, the line is discharged to the low level.

Also, the match line sense circuit 18 detects the level of the match line ML after the search, amplifies this level, and outputs it. The match line sense output MT, which is output from the match line sense circuit 18, is supplied to the priority encoder (not shown in the figure), and the memory address of the word at which the match is detected is encoded and output in accordance with a predetermined priority.

The configurations of the search-bit line driver 14, the match line pre-charge circuit 16, and the match line sense circuit 18 have no restriction, and thus any well-known conventional circuit having the same function can be applied to them. Also, in each circuit shown in FIGS. 2 and 3, such as the CAM cell 24, the search-bit line driver 14, each circuit can be configured by exchanging the power supply and ground, and inverting the polarity of each internal signal, and by exchanging NMOS and PMOS. Moreover, this also applies in the following embodiments.

Next, a description will be given of the CAM device according to a second embodiment of the present invention. This embodiment is an example of the case where the operation of the match detection circuit is controlled depending on the setting of the operation mode register 20.

Figure 4:
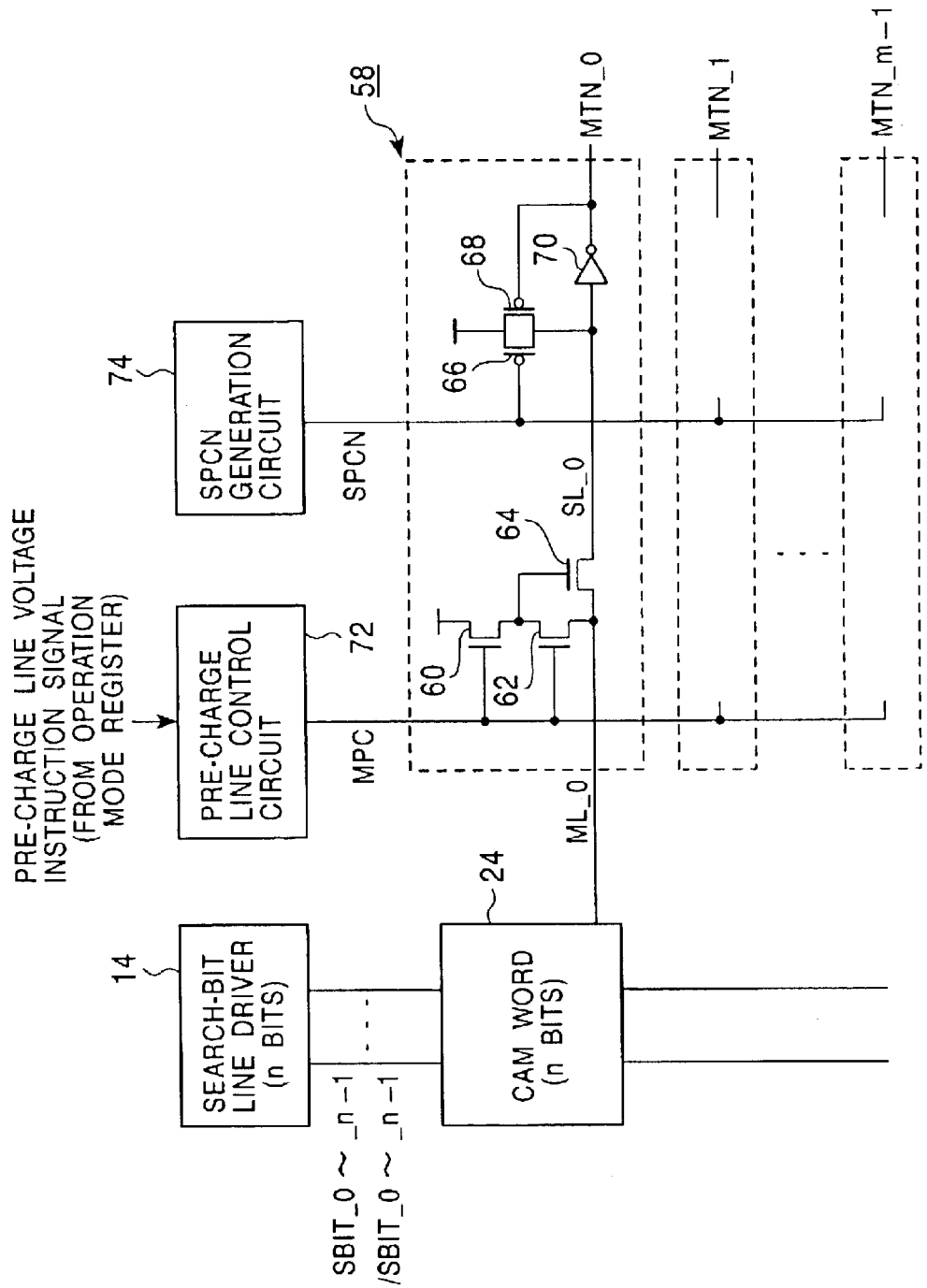
FIG. 4 is a schematic diagram of an example of a match detection circuit used in a CAM device according to a second embodiment of the present invention.

FIG. 4 is a schematic diagram of an example of the match detection circuit according to the present invention. The match detection circuit 58 shown in FIG. 4 is provided for each word of the m words, and includes two NMOSs 60 and 62 which form a match line pre-charge circuit, and an NMOS 64, PMOSs 66 and 68, and an inverter 70, which form the match line sense circuit.

Here, the NMOSs 60 and 62 are connected in series between the power supply and the match line ML, and the NMOS 64, which forms a charge transfer amplifier, is connected between the match line ML and the sense node SL. The gates of NMOSs 60 and 62 are commonly connected to the pre-charge line MPC for the match line ML which is driven by a pre-charge line control circuit 72. The gate of the NMOS 64 is connected to the connection point of these two NMOSs 60 and 62 as the clamp voltage.

Also, the inverter 70 is connected between the sense node SL and the match-sense output line MTN, and the PMOSs 66 and 68 are connected in parallel between the power supply and the sense node SL. The gate of the PMOS 66 is connected to the pre-charge line SPCN of the sense node SL which is driven by a SPCN generation circuit 74, and the gate of the PMOS 68 is connected to the output of the inverter 70, that is, to the match-sense output line MTN.

In the match detection circuit 58, at standby time, the pre-charge line SPCN for the sense node SL is set to low, turning on the PMOS 66, and thus the sense node SL is pre-charged to the power-supply voltage through the PMOS 66. Therefore, the high level of the sense node SL is inverted by the inverter 70, and thus the low level is output as the match-sense output MTN. Accordingly, the sense node SL is also pre-charged to the power-supply voltage by the PMOS 68.

Also, the pre-charge line MPC for the match line ML is set to, for example, the power-supply voltage VDD, and the match line ML is pre-charged to VDD−Vth (Vth is the NMOS threshold voltage) through the two NMOSs 60 and 62. Also, the connection point of the NMOSs 60 and 62 is used as the clamp voltage, and the voltage of this node also becomes VDD−Vth. Thus the NMOS 64 is turned off.

Thereafter the pre-charge line SPCN for the sense node SL is set to high, the pre-charge line MPC for the match line ML is set to low, and thus the PMOS 66 and the NMOSs 60 and 62 are turned off. At this time, the sense node SL and the match-sense output MTN remain in the above-described individual states. Also, the match line ML remains at the floating high voltage VDD−Vth.

As a result of searching, if the storage data and the search data match for all bits of one word, the level of the match line ML, that is, the match-sense output MTN, is maintained. On the other hand, if they do not match, even for one bit, when the voltage of the match line ML becomes lower than the pre-charge voltage VDD−Vth by more than the threshold voltage Vth of NMOS 64 (the voltage between the gate and the source of NMOS 64, that is, Vgs>Vth), in other words, when the voltage of the match line ML becomes less than VDD−2Vth, then the NMOS 64 is turned on.

The load capacitance of the match line ML is very large as compared with that of the sense node SL, and thus there is an amplification effect of the sense node SL. The pre-charged charge at the sense node SL is drawn to the match line ML at high speed through the NMOS 64, and therefore the match line ML and the sense node SL have the same voltage. When the voltage of the sense node SL becomes lower than the threshold value of the inverter 70, the high level voltage is output as the match-sense output MTN.

In this manner, when the match line ML becomes a little lower than VDD−2Vth, the NMOS 64 is turned on, and thus the sense node SL becomes the same voltage as that of the match line ML at high speed. Therefore, match detection is performed at high speed.

Here, in the match detection circuit 58 of the present invention, in response to the pre-charge line voltage instruction signal, which is supplied depending on the setting of the operation mode register 20, the pre-charge line control circuit 72 appropriately changes the high level voltage of the pre-charge line MPC.

For example, if the high level voltage of the pre-charge line MPC is set lower than the power-supply voltage VDD by the NMOS threshold voltage Vth, the pre-charge level of the match line ML and the clamp voltage level becomes VDD−2Vth, which is Vth lower. Also, if the high level voltage of the pre-charge line MPC is set Vth higher than VDD, the pre-charge level of the match line ML and the clamp voltage level becomes VDD.

In this manner, the pre-charge level of the match line ML and the clamp voltage level can be adjusted to the intermediate voltage, which is lower than the high level voltage of the pre-charge line MPC by Vth. Also, if the power supply and ground are exchanged, NMOS and PMOS transistors are exchanged, the polarities of the signals are inverted, then the pre-charge level of the match line ML and the clamp voltage level can be adjusted to the intermediate voltage, which is higher than the low level voltage of the pre-charge line MPC by Vth.

In this regard, the high level of the match line ML and the clamp voltage is enough if they can turn on the NMOS 64 and can invert the output signal of the inverter 70. The lower the voltage is set, the less the power consumption becomes, but the speed of discharging the sense node SL becomes lower, which means that the search speed decreases. However, the operation speed and the power consumption can be appropriately adjusted as desired by changing the high level voltage of the pre-charge line MPC, depending on the setting of the operation mode register 20.

Next, a description will be given of the CAM device according to a third embodiment of the present invention.

Figure 5:
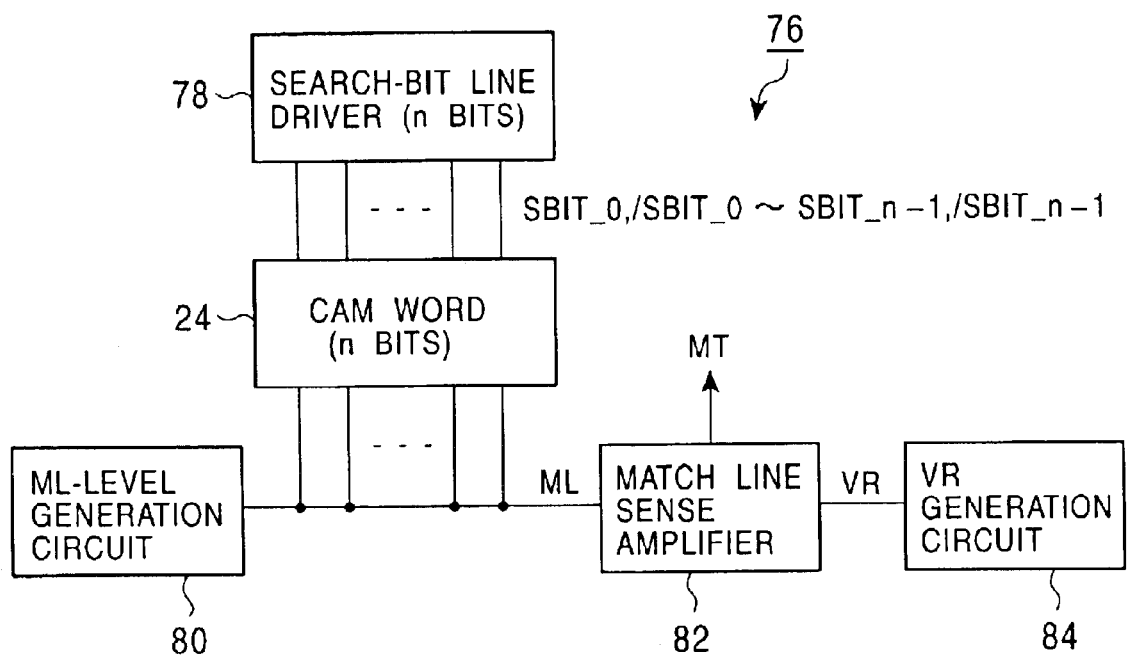
FIG. 5 is a schematic diagram of a CAM device according to a third embodiment of the present invention.

FIG. 5 is a schematic diagram of the CAM device according to the third embodiment of the present invention.

The CAM device 76 shown in FIG. 5 is capable of adjusting the amplitude of the search-bit line pair SBIT and /SBIT and the amplitude of the match line ML at search time, and includes n-bit CAM cells in a CAM word 24, a search-bit line driver 78, a match line (ML) level generation circuit 80, a match line sense amplifier 82, and a reference-voltage VR generation circuit 84.

In the following, a description will be given of the search-bit line driver 78 shown in FIG. 6, the match line level generation circuit 80 shown in FIG. 7, and the reference-voltage generation circuit 84 shown in FIG. 8, with reference to specific examples.

Figure 6:
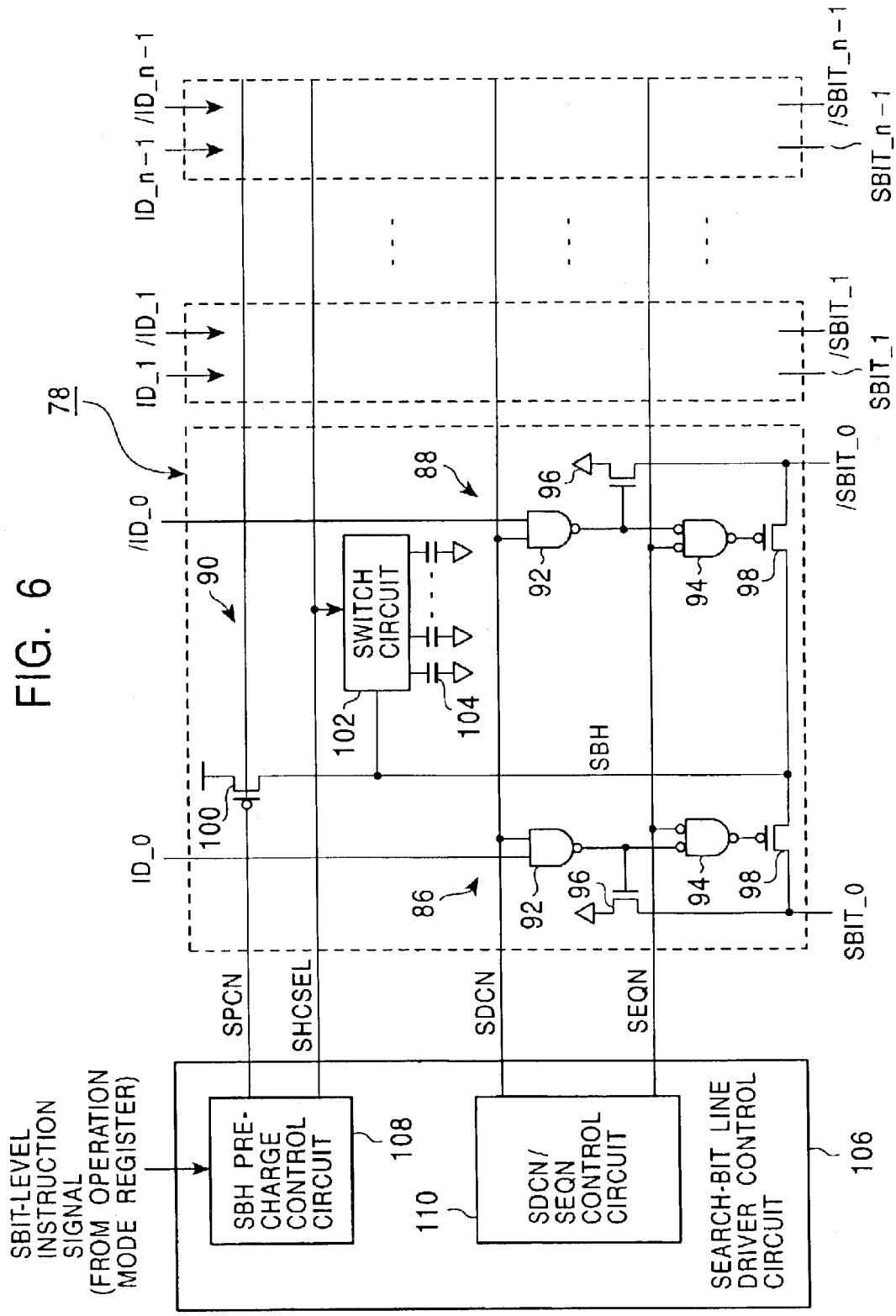
FIG. 6 is an example of the search-bit line driver used in the CAM device according to the third embodiment of the present invention.

First, as shown in FIG. 6, the search-bit line driver 78 is disposed corresponding to each bit of the n bits word, and sets the high level of the search-bit line pair at search time to the intermediate voltage by charge sharing (capacitance division) between the internal node SBH and one line of the search-bit line pair SBIT and /SBIT. The driver includes a control circuit 86 of the search-bit line SBIT, a control circuit 88 of the search-bit-bar line /SBIT, and a charge-storage control circuit 90.

Here the control circuit 86 includes NAND gate 92 and OR gate 94, an NMOS 96 for discharging, and a PMOS 98 for equalizing. The two inputs of the NAND gate 92 are connected to the search data ID and the signal SDCN, and its output is connected to the gate of the NMOS 96 and one of the OR gate 94. The other input of the OR gate 94 is connected to the signal SEQN, and its output is connected to the gate of the PMOS 98. Also, the NMOS 96 is connected between the search-bit line SBIT and ground, and the PMOS 98 is connected between the search-bit line SBIT and the internal node SBH.

The control circuit 88 has the same configuration as that of the control circuit 86 except that the search-bit line SBIT is changed to the search-bit-bar line /SBIT, and the search data ID is changed to its inverted data /ID, and thus the detailed description thereof is omitted.

Also, the charge-storage control circuit 90 includes a PMOS 100, a switch circuit 102, and a plurality of capacitors 104.

The PMOS 100 is connected between the power-supply and the internal node SBH, and its gate is connected to the signal SPCN. Also, a plurality of capacitors 104 are individually connected between the internal node SBH and ground through individual switches (not shown in the figure) included in the switch circuit 102. Turning on/off the switch corresponding to each capacitor 104 is controlled by a signal SHCSEL. Also, the plurality of capacitors 104 may have the same capacitance, or they may each have different capacitances. Also, the switch circuit 102 may turn on only one switch corresponding to each capacitor 104, or it may turn on more than one switch simultaneously.

Here, the operation of the search-bit line driver 78 is controlled by each of the signals SPCN, SHCSEL, SDCN, and SEQN which are supplied from a search-bit line driver control circuit 106 shown on the left side of FIG. 6.

The control circuit 106 includes a SBH pre-charge control circuit 108 which outputs the signals SPCN and SHCSEL in response to the SBIT-level instruction signal supplied from the operation mode register 20, and a SDCN/SEQN control circuit 110 which outputs the signals SDCN and SEQN.

In the search-bit line driver 78 shown in FIG. 6, the signal SEQN is set to high at standby time, and then the signals SPCN and. SDCN are set to low. Also, each switch included in the switch circuit 102 is on/off controlled in order to connect or not to connect the corresponding capacitor 104 to the internal node SBH by SHCSEL, which is generated in response to the SBIT-level instruction signal supplied form the operation mode register 20.

As a result, in the control circuit 86, the output signal of the NAND gate 92 becomes high, the output signal of the OR gate 94 also becomes high, the NMOS 96 is turned on, and the PMOS 98 is turned off. Accordingly, the search-bit line SBIT and the internal node SBH are electrically separated, and the search-bit line SBIT is discharged to the ground voltage through the NMOS 96.

In the same manner, in the control circuit 88, the search-bit-bar line /SBIT and the internal node SBH are electrically separated, and the search-bit-bar line /SBIT is discharged to the ground voltage.

Also, in the charge-storage control circuit 90, the PMOS 100 is turned on, the internal node SBH is pre-charged to the power-supply voltage, and at the same time, each corresponding capacitor 104 is pre-charged to the power-supply voltage through each turned-on switch of the switch circuit 102.

On the other hand, during match searching, first the signals SPCN and SDCN are set to high, and then the signal SEQN is set to low.

First, when both of the signals SDCN and SPCN are set to high, in the control circuit 86 of the search-bit line SBIT, the output signal of the NAND gate 92 becomes the inverted level of the voltage level of the signal ID. Thus when the search data ID is low, the NMOS 96 remains in the on state, and when the search data ID is high, the NMOS 96 is turned off, and the search-bit line SBIT enters the floating low state of the ground voltage, which has been discharged at standby time. Therefore, at this time, the PMOS 98 remains in the off state.

On the other hand, in the control circuit 88, when the inverted search data /ID is low (search data ID is high), the NMOS 96 remains in the on state. Also, when the inverted search data /ID is high, the NMOS 96 is turned off and the search-bit-bar line /SBIT enters the floating low state of the ground voltage, which has been discharged at standby time.

Also, in the charge-storage control circuit 90, the PMOS 100 is turned off, the internal node SBH enters the floating high state of the power-supply voltage, which has been pre-charged at standby time.

Thereafter when the signal SEQN is set to low, in the control circuit 86, the output signal of the OR gate 94 becomes the inverted level of the voltage level of the search data ID.

Accordingly, when the search data ID is low, the PMOS 98 remains off, and the search-bit line SBIT remains in the state having discharged to the ground through the NMOS 96. Also, when the search data ID is high, the PMOS 98 is turned on, the line SBIT and the internal node SBH are electrically connected, and the voltage of the line SBIT becomes the intermediate voltage in the charge sharing state.

On the other hand, the control circuit 88 becomes the opposite state to that of the control circuit 86. Specifically, when the inverted search data /ID is low, the line /SBIT remains in the state having discharged to the ground. Also, when the inverted search data /ID is high, the voltage of the line /SBIT becomes the intermediate voltage in the charge sharing state.

In the search-bit line driver 78, the switch circuit 102 is controlled on/off depending on the setting of the operation mode register 20, and the capacitance of the capacitor 104 to be connected to the internal node SBH can be changed. By this, the high level voltage of the search-bit line pair SBIT and /SBIT at search time can be appropriately adjusted to give the desired operation speed and power consumption.

Also, in the search-bit line driver 78, after one of the search-bit line pair SBIT and /SBIT and the internal node SBH are electrically connected depending on the SBIT-level instruction signal supplied from the operation mode register 20, and before the CAM word 24 actually starts the search operation, it is possible to set the signal SPCN to low, and to turn on the PMOS 100. By this means, the high level of the search-bit line pair SBIT and /SBIT can be controlled so as to be charged up to the power-supply voltage.

Figure 7:
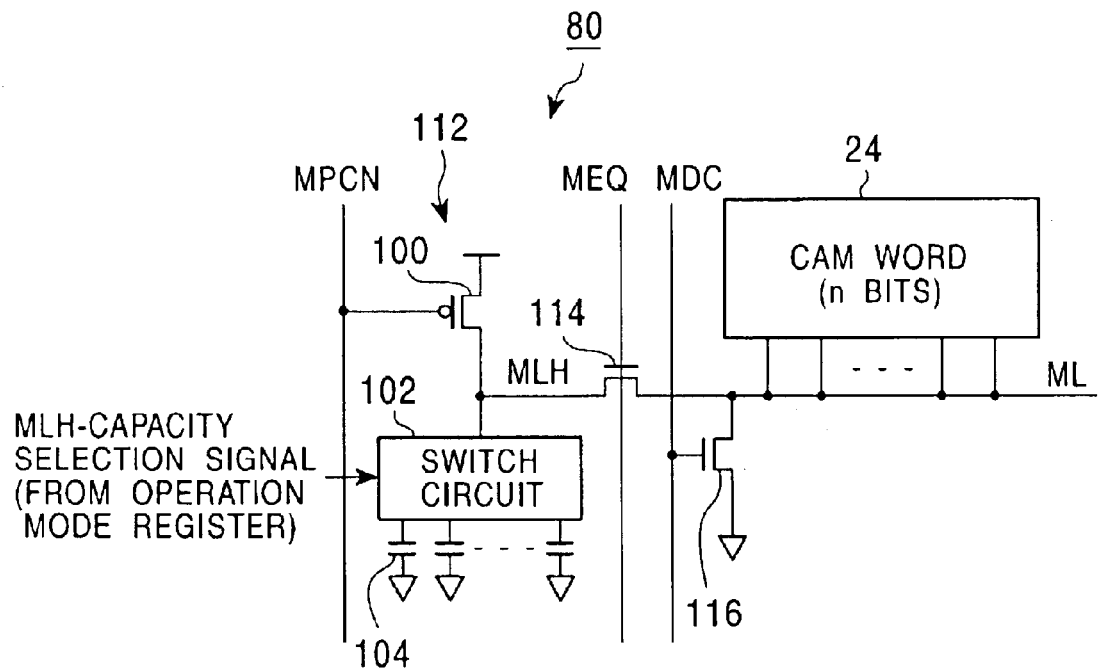
FIG. 7 is a schematic diagram of a match line level generation circuit used in the CAM device according to the third embodiment of the present invention.

Next, in the CAM device 76, as shown in FIG. 7, the match line level generation circuit 80 sets the match line ML pre-charge level at the intermediate voltage by charge sharing between the match line ML and the internal node MLH, and includes a charge-storage control circuit 112, an equalization NMOS 114, and a discharge NMOS 116.

The control circuit 112 shown in FIG. 7 has the same configuration as that of the charge-storage control circuit 90 shown in FIG. 6 except that the internal node SBH is replaced by the internal node MLH, and includes a PMOS 100, a switch circuit 102, and a plurality of capacitors 104. Turning on/off of the switch circuit 102 is controlled in response to a MLH-capacity selection signal, which is generated based on the setting of the operation mode register 20.

Also, the NMOS 116 is connected between the match line ML and ground, and its gate is connected to the signal MDC. The NMOS 114 is connected between the internal node MLH and the match line ML, and its gate is connected to the signal MEQ.

In the match line level generation circuit 80, the signal MEQ is set to low at standby time, and then a signal MPCN is set to low and the signal MDC is set to high.

As a result, the NMOS 114 is turned off, the internal node MLH and the match line ML are electrically separated, the internal node MLH is charged up to the power-supply voltage by the PMOS 100, and at the same time, the corresponding capacitor 104 is charged up through the switch circuit 102. Also, the match line ML is discharged to the ground by the NMOS 116.

At search time, a signal MPCN is set to high, a signal MDC is set to low, and then the signal MEQ is set to high.

First, when the signal MPCN is set to high, and the signal MDC is set to low, the internal node MLH becomes floating high state of the power-supply voltage charged at standby time, and, at the same time, the match line ML becomes the floating low state of the ground voltage discharged at standby time. Thereafter when the signal MEQ is set to high, the NMOS 114 is turned on, the internal node MLH and the match line ML are electrically connected, and the voltage of the match line ML becomes the intermediate voltage in the charge sharing state.

In the match line level generation circuit 80, the capacitance of the capacitor 104 to be connected to the internal node MLH can also be changed appropriately by controlling the switch circuit 102 to turn on/off depending on the setting of the operation mode register 20. Thus the high level voltage of the match line ML at search time can be appropriately adjusted to have the desired operation speed and power consumption. The high level voltage of the match line ML at search time may be an intermediate voltage in the range which is higher than a reference voltage VR described below and lower than the power-supply voltage.

Figure 8:
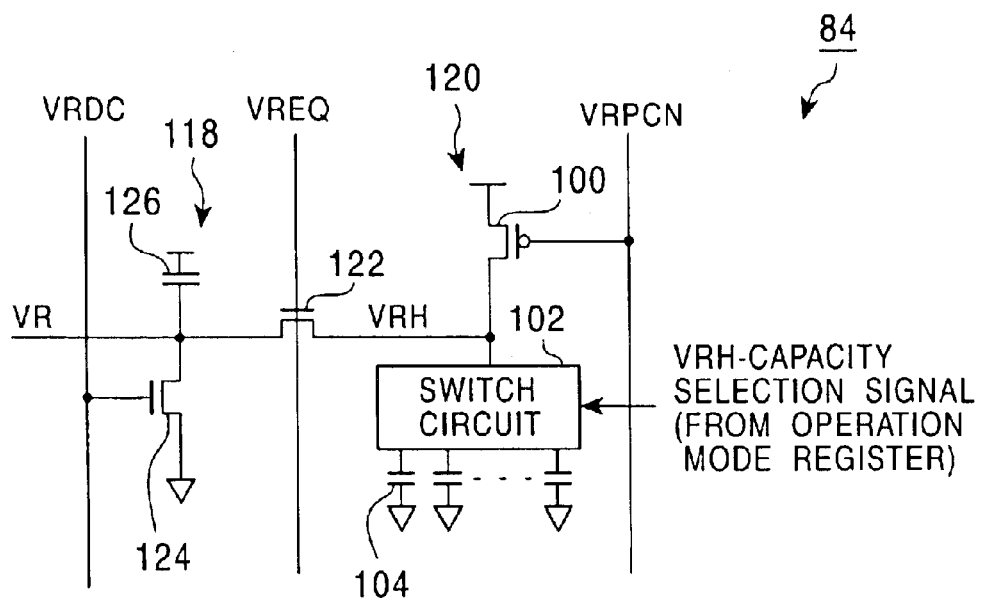
FIG. 8 is a schematic diagram of a reference-voltage generation circuit used in the CAM device according to the third embodiment of the present invention.
Figure 9:
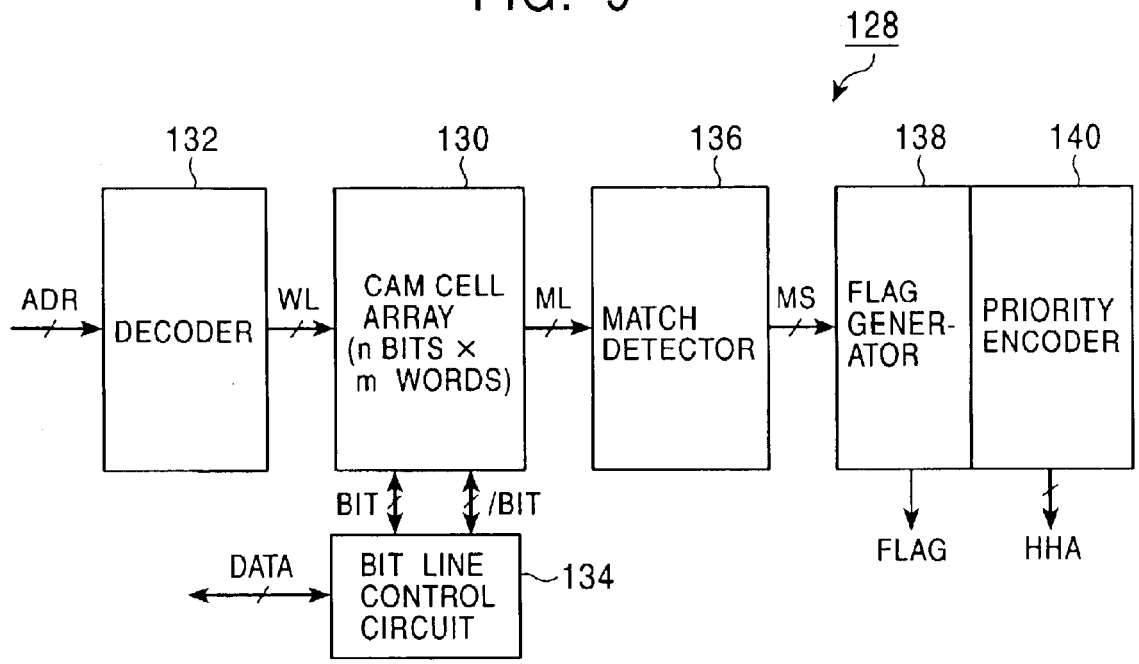
FIG. 9 is a schematic diagram of an example of a conventional CAM device.

Next, in the CAM device 76, as shown in FIG. 8, the reference-voltage generation circuit 84 generates a reference voltage VR of the intermediate voltage for detecting the match line voltage after the search by sharing charge between the two internal nodes VR and VRH, and includes charge-storage control circuits 118 and 120, and an equalization NMOS 122.

The control circuit 120 shown in FIG. 8 has the same configuration as that of the charge-storage control circuit 90 shown in FIG. 6 except that the internal node SBH is replaced by the internal node VRH, and includes a PMOS 100, a switch circuit 102, and a plurality of capacitors 104. Turning on/off of the switch circuit 102 is controlled in response to the VRH-capacitance selection signal generated based on the setting of the operation mode register 20.

Also, the control circuit 118 includes an NMOS 124 and a capacitor 126. The NMOS 124 is connected between the internal node VR and ground, and its gate is connected to the signal VRDC. Also, the capacitor 126 is connected between the power-supply and the internal node VR. Also, the NMOS 122 is connected between the internal node VHR and the internal node VR, and its gate is connected to the signal VREQ.

In the circuit 84, the signal VREQ is set to low at standby time, and then a signal VRPCN is set to low and the signal VRDC is set to high.

As a result, NMOS 122 is turned off, the internal nodes VRH and VR are electrically separated, the internal node VRH is charged up to the power-supply voltage by PMOS 100, and at the same time, the corresponding capacitor 104 is charged through the switch circuit 102. Also, the internal node VR is discharged to the ground by the NMOS 124.

At search time, the signal VRPCN is set to high, the signal VRDC is set to low, and then the signal VREQ is set to high.

First, when the signal VRPCN is set to high, and the signal VRDC is set to low, the internal node VRH becomes the floating high state of the power-supply voltage charged at standby time, and, at the same time, the internal node VR becomes the floating low state of the ground voltage discharged at standby time. Thereafter, when the signal VREQ is set to high, the NMOS 122 is turned on, the internal nodes VRH and VR are electrically connected, and the voltage of the internal node VR becomes the intermediate voltage in the charge sharing state.

In the circuit 84, the capacitance of the capacitor 104 to be connected to the internal node VRH can also be changed appropriately by controlling the switch circuit 102 to turn on/off depending on the setting of the operation mode register 20. Thus the voltage of the reference voltage at search time can be appropriately adjusted to have the desired operation speed and power consumption. In this regard, the reference voltage at search time may be an intermediate voltage in the range which is higher than the low level voltage of the above-described match line ML at search time and lower than the power-supply voltage.

Finally, in the CAM device 76, the match line sense amplifier 82 detects the voltage of the match line ML based on the reference voltage VR, and amplifies and outputs it. As a result of the search, it is often the case that unmatched bits are detected for almost all words. Thus it is preferable that the match line sense amplifier 82 is set such as both the match-sense output MT in the standby state and the output MT when unmatched bits are detected are the same voltage level, so as to make it possible to reduce the current consumed.

In the CAM device 76, the search-bit line driver 78 sets one line of the search-bit line pair SBIT and /SBIT to the high level (intermediate voltage) and the other to the low level (ground voltage), depending on the voltage level of search data ID input to the CAM device 76 from the outside at search time. Also, the match line ML is set to the high level (intermediate voltage) by the match line level generation circuit 80 in the present embodiment.

As a result of the search, the match line ML remains at the high level (intermediate voltage) pre-charged before the search, only when a match is detected between the search data and the storage data for all n-bits for one word connected to the match line ML. To put it another way, if at least one bit in one word is detected to be unmatched, the match line ML becomes the low level (ground voltage).

Also, the voltage level of the match line ML is detected by comparing the voltage level of the match line ML and the reference voltage VR by the match-sense amplifier 82 after the search, and the search result is output as the match-sense output MT. In the case of the present embodiment, the match-sense output MT is low in the standby state and when an unmatched occurs, and the high level is output when a match occurs.

Further, means for forming the capacitors 104 and 126 used in the CAM device 76 is not limited at all. The capacitors formed by various means, for example, the gate capacitance of a MOS transistor, a capacitor made of metal wiring and polysilicon, or the junction capacitance of a PN junction, can be used. The CAM cell can be used as a dummy capacitance element.

Also, the search-bit line driver 78, the match line level generation circuit 80, and the reference-voltage generation circuit 84 are not limited to the examples shown in the figure; they can be achieved by other circuits having the same functions. Also, it is possible to configure a circuit by exchanging the power supply and ground, NMOS and PMOS transistors, and inverting the polarity of the signals.

The CAM device of the present invention is basically configured as described above.

However, the present invention is not limited to the above-described embodiments. Various variations and changes may be naturally made without departing from the spirit and scope of the present invention.

The CAM device of the present invention is provided with the operation mode setting means, and the operating voltage of at least part of the internal circuit is controlled depending on the setting of the operation mode setting means.

Therefore, in the CAM device of the present invention, it is possible to set the operation mode appropriately to meet the required operation speed and power consumption; for example, it is possible to set a mode attaching importance to operation speed, or a mode attaching importance to power consumption. It is therefore possible to flexibly cope with various user requirements. Also, when the operation mode is set to attach importance to operation speed, it is possible to operate the device at the minimum power consumption required for achieving the requested operation speed, and thus the power consumption can be reduced to the utmost.

What is claimed is:

1. A content addressable memory device comprising:
   an operation mode setting means for setting an operation mode out of a plurality of power consumption modes and/or speed modes at a search operation; and
   an internal voltage generation circuit which generates an internal voltage of a higher or lower voltage than a power-supply voltage which is externally supplied, depending on a setting of the operation mode setting means,
   wherein at least one of a high level voltage of search-bit lines and a high level voltage of match lines is set to the internal voltage generated by the internal voltage generation circuit.

2. A content addressable memory device according to claim 1, wherein the content addressable memory device has CAM memory cells arranged in matrix implemented CMOS CAM cells.

3. A content addressable memory device according to claim 2, wherein said operation mode setting means comprises a register holding at least one bit.

4. A content addressable memory device according to claim 3, wherein the register allows data thereof to be set from the outside.

5. A content addressable memory device according to claim 3, wherein data in the register is fixed during manufacture.

6. A content addressable memory device according to claim 3, wherein the internal voltage generation circuit includes a P-type MOS transistor disposed between a power-supply voltage line and an internal voltage line, and an N-type MOS transistor disposed between the power-supply voltage line and the internal voltage line,
   and the internal voltage is generated by turning on one of the P-type MOS transistor and the N-type MOS transistor depending on the setting of said operation mode setting means.

7. A content addressable memory device according to claim 1, wherein said operation mode setting means comprises at least one external terminal.

8. A content addressable memory device according to claim 7, wherein the internal voltage generation circuit includes a P-type MOS transistor disposed between a power-supply voltage line and an internal voltage line, and an N-type MOS transistor disposed between the power-supply voltage line and the internal voltage line,
   and the internal voltage is generated by turning on one of the P-type MOS transistor and the N-type MOS transistor depending on the setting of said operation mode setting means.

9. A content addressable memory device comprising:
   an operation mode setting means for setting an operation mode out of a plurality of power consumption modes and/or speed modes at a search operation; and
   a bit line amplitude adjusting means for adjusting an amplitude of bit line depending on a setting of said operation mode setting means.

10. A content addressable memory device according to claim 9, wherein said bit line amplitude adjusting means comprises an amplitude adjusting circuit of a search-bit line pair.

11. A content addressable memory device according to claim 10, said amplitude adjusting circuit comprising:
    a pre-charging circuit for an internal node,
    a switch circuit including at least one switch which is controlled on/off depending on the setting of the operation mode setting means, and at least one capacitor which is individually connected to the internal node through corresponding switches included in the switch circuit,
    at standby time, the amplitude adjusting circuit electrically separates the search-bit line pair from the internal node, the pre-charging circuit pre-charges the internal node and the at least one capacitor which is connected to the internal node through the at least one switch to be turned on, depending on the setting of the operation mode setting means,
    at search time, the amplitude adjusting circuit connects one line of the search-bit line pair and the internal node, and generates an intermediate voltage which is determined by charge sharing depending on a capacitance of the capacitor connected to the internal node.

12. A content addressable memory device according to claim 11, wherein, the pre-charging circuit determines whether the internal node is pre-charged only at standby time, or whether the internal node is pre-charged between the time when one line of the search-bit line pair and the internal node are electrically connected and the time when a search is started.

13. A content addressable memory device comprising:
    an operation mode setting means for setting an operation mode out of a plurality of power consumption modes and/or speed modes at a search operation; and
    a match line pre-charge voltage adjusting means for adjusting a pre-charge voltage of match line depending on a setting of the operation mode setting means.

14. A content addressable memory device according to claim 13, wherein said match line pre-charge voltage adjusting means is connected between the match line and a sense node, and comprises:
    a first transistor which is controlled on/off by a clamp voltage, a second transistor which pre-charges the match line depending on the setting of the operation mode setting means, and at the same time, generates the clamp voltage to control the on/off of the first transistor, and a pre-charging circuit of the sense node, wherein, at standby time, the pre-charging circuit of the sense node pre-charges the sense node, and at the same time, the second transistor pre-charges the match line to an intermediate voltage lower or higher by a threshold voltage of the second transistor, than a gate voltage of the second transistor, and sets the clamp voltage to the same voltage as the pre-charge voltage of the match line.

15. A content addressable memory device according to claim 13, said match line pre-charge voltage adjusting means comprising:

a pre-charging circuit for an internal node, a switch circuit including at least one switch which is controlled on/off depending on the setting of the operation mode setting means, and at least one capacitor which is individually connected to the internal node through corresponding switches included in the switch circuit, at standby time, the pre-charge voltage adjusting means electrically separates the match line from the internal node, the pre-charging circuit pre-charges the internal node and the at least one capacitor which is connected to the internal node through the at least one switch to be turned on, depending on the setting of the operation mode setting means, at search time, the pre-charge voltage adjusting means electrically connects the match line and the internal node, and generates an intermediate voltage which is determined by charge sharing depending on a capacitance of the capacitor connected to the internal node.

16. A content addressable memory device according to claim 15, further comprising:

a reference-voltage generation circuit which generates a reference voltage on a reference voltage line; and a match sense amplifier which detects the voltage of the match line based on the reference voltage, and amplifies the voltage and outputs the amplified voltage as a match-sense output.

17. A content addressable memory device according to claim 16, wherein said reference-voltage generation circuit comprises:

a pre-charging circuit for an internal node, a switch circuit including at least one switch which is controlled on/off depending on the setting of the operation mode setting means, and at least one capacitor which is individually connected to the internal node through corresponding switches included in the switch circuit, wherein, at standby time, the reference voltage line and the internal node are electrically separated, the pre-charging circuit pre-charges the internal node and the capacitor which is connected to the internal node through the corresponding switch to be turned on, depending on the setting of the operation mode setting means, at search time, the reference-voltage line and the internal node are electrically connected, an intermediate voltage is generated by charge sharing.

* * * * *